(12) United States Patent
Hur et al.

(10) Patent No.: US 9,656,854 B2
(45) Date of Patent: May 23, 2017

(54) MEMS MICROPHONE WITH DUAL-BACK PLATE AND METHOD OF MANUFACTURING THE SAME

(71) Applicant: KOREA INSTITUTE OF MACHINERY & MATERIALS, Daejeon (KR)

(72) Inventors: Shin Hur, Daejeon (KR); Young Do Jung, Daejeon (KR); Young Hwa Lee, Daejeon (KR); Jun Hyuk Kwak, Daejeon (KR); Chang-Hyeon Ji, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 0 days.

(21) Appl. No.: 14/394,473

(22) PCT Filed: Nov. 29, 2012

(86) PCT No.: PCT/KR2012/010259
§ 371 (c)(1),
(2) Date: Oct. 15, 2014

(87) PCT Pub. No.: WO2013/168868
PCT Pub. Date: Nov. 14, 2013

(65) Prior Publication Data
US 2015/0129992 A1 May 14, 2015

(30) Foreign Application Priority Data
May 9, 2012 (KR) .................. 10-2012-0048922

(51) Int. Cl.
*B81B 3/00* (2006.01)
*H04R 19/04* (2006.01)
(Continued)

(52) U.S. Cl.
CPC ........ *B81B 3/0086* (2013.01); *B81C 1/00698* (2013.01); *C25D 1/08* (2013.01);
(Continued)

(58) Field of Classification Search
CPC .......... B81B 3/0086; B81B 2201/0257; B81B 2203/0127; B81B 2201/0264; C25D 5/02; B81C 1/00698
(Continued)

(56) References Cited

U.S. PATENT DOCUMENTS

| | | |
|---|---|---|
| 5,490,220 A | 2/1996 | Loeppert |
| 6,943,448 B2 | 9/2005 | Gabriel et al. |

(Continued)

FOREIGN PATENT DOCUMENTS

| | | |
|---|---|---|
| EP | 0561566 | 7/1999 |
| JP | 2004223708 | 8/2004 |

(Continued)

*Primary Examiner* — Chuong A Luu
*Assistant Examiner* — Rodolfo D Fortich
(74) *Attorney, Agent, or Firm* — Lex IP Meister, PLLC

(57) ABSTRACT

Disclosed herein are a microelectromechanical systems (MEMS) microphone with a dual-back plate, and a method of manufacturing the same. The MEMS microphone according to an exemplary embodiment of the present invention includes: a substrate having a first back plate formed at a central portion thereof; a membrane plate disposed on first support parts formed at both sides on the substrate and vibrated depending on external sound pressure; and a second back plate disposed on second support parts formed at both sides of the membrane plate.

6 Claims, 7 Drawing Sheets

(51) Int. Cl.

| | |
|---|---|
| *H04R 19/00* | (2006.01) |
| *B81C 1/00* | (2006.01) |
| *C25D 3/04* | (2006.01) |
| *C25D 3/12* | (2006.01) |
| *C25D 3/38* | (2006.01) |
| *C25D 3/44* | (2006.01) |
| *C25D 3/46* | (2006.01) |
| *C25D 3/54* | (2006.01) |
| *C25D 3/56* | (2006.01) |
| *C25D 5/02* | (2006.01) |
| *C25D 5/34* | (2006.01) |
| *C25D 7/12* | (2006.01) |
| *C25D 1/08* | (2006.01) |

(52) U.S. Cl.
CPC ............... *C25D 3/04* (2013.01); *C25D 3/12* (2013.01); *C25D 3/38* (2013.01); *C25D 3/44* (2013.01); *C25D 3/46* (2013.01); *C25D 3/54* (2013.01); *C25D 3/56* (2013.01); *C25D 5/02* (2013.01); *C25D 5/34* (2013.01); *C25D 7/12* (2013.01); *H04R 19/005* (2013.01); *H04R 19/04* (2013.01); *B81B 2201/0257* (2013.01)

(58) Field of Classification Search
USPC .................. 257/416, 417, 432, 443, 294
See application file for complete search history.

(56) References Cited

U.S. PATENT DOCUMENTS

| | | | |
|---|---|---|---|
| 7,202,101 B2 | 4/2007 | Gabriel et al. | |
| 7,620,192 B2 | 11/2009 | Yamaoka et al. | |
| 2007/0193358 A1 | 8/2007 | Kagawa et al. | |
| 2010/0212432 A1* | 8/2010 | Kasai et al. | H04R 19/005 |
| | | | 73/654 |
| 2011/0108838 A1* | 5/2011 | Kageyama | B06B 1/0292 |
| | | | 257/49 |

FOREIGN PATENT DOCUMENTS

| | | |
|---|---|---|
| JP | 2005-183437 | 7/2005 |
| JP | 2005229439 | 8/2005 |
| JP | 2007-194913 | 8/2007 |
| JP | 2011-193342 | 9/2011 |
| KR | 20060114017 | 11/2006 |
| KR | 20060115870 | 11/2006 |

* cited by examiner

MEMS MICROPHONE WITH DUAL-BACK PLATE AND METHOD OF MANUFACTURING THE SAME

TECHNICAL FIELD

The present invention relates to a microelectromechanical systems (MEMS) microphone and a method of manufacturing the same. More particularly, the present invention relates to a MEMS microphone with a dual-back plate and a method of manufacturing the same.

BACKGROUND ART

A microphone using a principle in which a change in a capacitance generated by vibrating a diaphragm by external vibration sound pressure is output as an electrical signal has been used in various fields such as a microphone, a phone, a mobile phone, a recorder, and the like.

Particularly, a capacitance type of microphone configured with the diaphragm that is vibrated by the sound pressure and a fixed electrode disposed at a side opposite to the diaphragm to convert a sound into an electrical signal depending on a change in a capacitance has been widely used in a sound device, a precise measurement device, or the like, due to advantages such as a comparatively simple structure, a high signal-to-noise ratio, excellent frequency characteristics, and the like.

Meanwhile, recently, in accordance with miniaturization of electronic devices and development of personal portable multimedia devices, a demand for a miniature microphone has increased. Therefore, when manufacturing the microphone, interest in a method of manufacturing a microelectromechanical systems (MEMS) microphone using a semiconductor process technology has increased.

In the MEMS microphone, methods for simplifying a process for manufacturing the microphone at a low cost and high efficiency while improving a yield have been sought.

DISCLOSURE

Technical Problem

The present invention has been made in an effort to provide a microelectromechanical systems (MEMS) microphone having advantages of improving sensitivity by differentially amplifying two capacitances through a dual-back plate.

Further, the present invention has been made in an effort to provide a method of manufacturing a MEMS microphone having advantages of simplifying a process in manufacturing the MEMS microphone as described above.

Technical Solution

An exemplary embodiment of the present invention provides a MEMS microphone including: a substrate having a first back plate formed at a central portion thereof; a membrane plate disposed on first support parts formed at both sides on the substrate and vibrated depending on external sound pressure; and a second back plate disposed on second support parts formed at both sides of the membrane plate.

The first and second back plates may have a plurality of back plate holes formed therein, respectively.

The first and second back plates may be made of any one of silver (Ag), aluminum (Al), copper (Cu), chrome (Cr), nickel (Ni), and molybdenum (Mo), or an alloy thereof.

The membrane plate may be made of a semiconductor material, a metal material, or a combination thereof, or be formed in a dual-layer structure of an insulator material and the metal material.

The membrane plate may have a plurality of holes formed in a surface thereof, or may have a corrugation part formed in at least a portion of the surface thereof.

Heights of the first and second support parts may be different from each other.

Another exemplary embodiment of the present invention provides a method of manufacturing a MEMS microphone, including: a first step of preparing an integral substrate in which a base layer, a first insulating layer, and a membrane layer are sequentially stacked; a second step of forming a second insulating layer on an upper surface of the integral substrate; a third step of etching a central portion of the base layer of the integral substrate so that a lower surface of the first insulating layer is partially exposed; and a fourth step of forming back plates on the lower surface of the first insulating layer and an upper surface of the second insulating layer, respectively, through electroplating.

The method of manufacturing a MEMS microphone may further include, between the third and fourth steps, a step of forming a plurality of protrusion parts at predetermined intervals on each of the lower surface of the first insulating layer and the upper surface of the second insulating layer.

The method of manufacturing a MEMS microphone may further include, after the fourth step: a step of removing the protrusion parts; and a step of removing central portions of the first and second insulating layers.

The back plates may be made of any one of silver (Ag), aluminum (Al), copper (Cu), chrome (Cr), nickel (Ni), and molybdenum (Mo), or an alloy thereof.

The membrane layer may be made of a semiconductor material, a metal material, or a combination thereof, or be formed in a dual-layer structure of an insulator material and the metal material.

The membrane layer may have a plurality of holes formed in a surface thereof, or have a corrugation part formed in at least a portion of the surface thereof.

The first and second insulating layers may be formed at different heights.

Advantageous Effects

In exemplary embodiments of the present invention, the two back plates are formed above and below the membrane plate to differentially amplify two capacitances, thereby making it possible to improve sensitivity.

In addition, the two back plates are made of the metal to serve as the electrode pads in and of themselves, thereby making it possible to simplify a configuration of the microphone.

Further, when manufacturing the MEMS microphone, the integral substrate is used and the back plates are formed through the electroplating, thereby making it possible to simplify a process.

MODE FOR INVENTION

Hereinafter, exemplary embodiments of the present invention will be described in detail with reference to the accompanying drawings.

Figure 1:
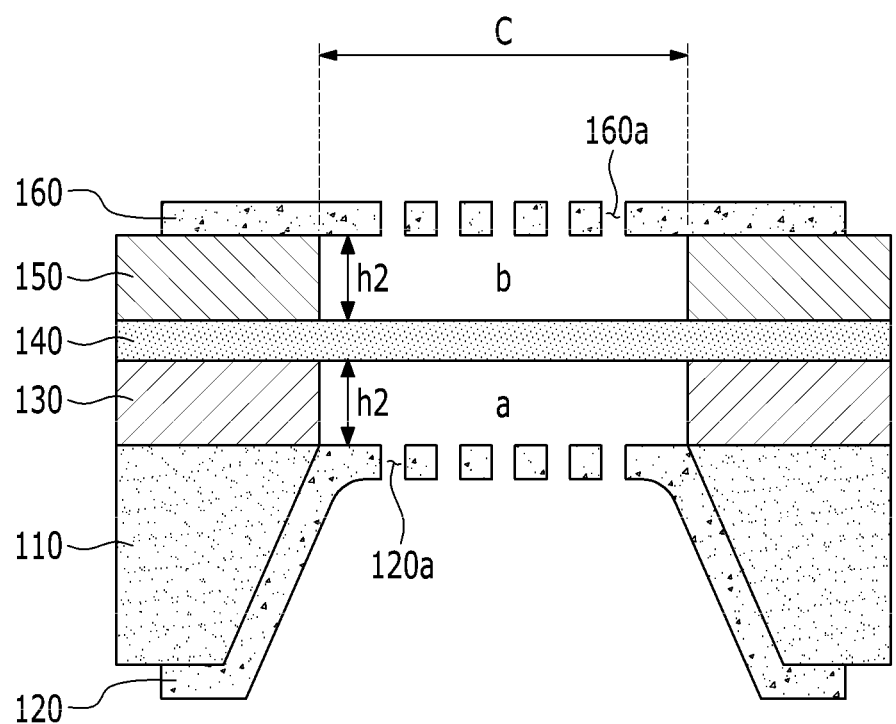
FIG. 1 is a cross-sectional view schematically showing a microelectromechanical systems (MEMS) microphone according to an exemplary embodiment of the present invention.

FIG. 1 is a cross-sectional view schematically showing a microelectromechanical systems (MEMS) microphone 100 according to an exemplary embodiment of the present invention.

Referring to FIG. 1, the MEMS microphone 100 may be configured to include a substrate 110 having a first back plate 120 formed therein, a membrane plate 140 disposed above the substrate 110, and a second back plate 160 disposed above the membrane plate 140.

In the present specification, a word "above" means an upward direction based on the accompanying drawings, and a word "below" means a downward direction based on the accompanying drawings. In addition, a central portion C, which means a space having a predetermined size based on the center of the MEMS microphone 100, indicates a vibration region.

The substrate 110 has a hole (not shown) formed in the central portion C. The substrate 110 may be a silicon substrate, but is not limited thereto. The hole is a place through which air enters and exits, and has the first back plate 120 formed therein. For example, the first back plate 120 may be formed in a flat plate form so that it is supported by an internal edge of the substrate 110 to thereby be filled in the hole. Here, the first back plate 120 has a plurality of back plate holes 120a formed in a surface thereof, and air may enter and exit the back plate holes 120a. The first back plate 120 may be made of any one of silver (Ag), aluminum (Al), copper (Cu), chrome (Cr), nickel (Ni), and molybdenum (Mo), or an alloy thereof, but is not limited thereto.

The substrate 110 has first support parts 130 formed at both sides thereon. The first support parts 130 serve to form a first air gap a between the first back plate 120 and the membrane plate 140 while simultaneously serving to support the membrane plate 140. The first support part 130 may be made of an oxide such as $SiO_2$ or the like, but is not limited thereto.

A height h1 of the first support part 130 is not limited. Since a size of the first air gap a may be changed depending on the height of the first support part 130, the height of the first support part 130 may be adjusted so as to correspond to a desired size of the first air gap a.

The first support parts 130 have the membrane plate 140 disposed thereon, wherein the membrane plate 140 has a thin film shape. That is, the membrane plate 140 has side portions supported by the first support parts 130, such that it is disposed so as to be spaced apart from the first back plate 120 by a predetermined interval. Therefore, the first air gap a is formed between the membrane plate 140 and the first back plate 120.

The membrane plate 140 is vibrated depending on external sound pressure to serve to generate a change in a capacitance. The membrane plate 140 may be made of a semiconductor material such as silicon or the like, a metal material such as aluminum, copper, nickel, titanium, tungsten, molybdenum, or the like, or a combination thereof. In addition, the membrane plate 140 may be formed in a dual-layer structure in which a metal material is stacked on an insulator material such as a silicon oxide layer, a silicon nitride layer, or the like. The case in which a membrane plate 140 is formed of a single layer has been shown in FIG. 1. A thickness of the membrane plate 140 is not limited, but may be, for example, 1 μm.

Meanwhile, a shape of the membrane plate 140 is not limited. For example, the membrane plate 140 may be formed in a thin plate shape. However, the membrane plate 140 may also have a plurality of holes irregularly formed in a surface thereof or have a corrugation part (not shown) formed in at least a portion of the surface thereof. The corrugation part means that corrugations are formed on a surface of the membrane plate 140 so as to be at least partially curved. In the case in which the corrugation part is formed on the surface of the membrane plate 140 as described above, compliance of the membrane plate 140 may be changed. However, hereinafter, for convenience of explanation, the case in which the membrane plate 140 is formed in the thin plate shape as shown in FIG. 1 will be mainly described.

The substrate 110, the first support parts 130, and the membrane plate 140 may be formed by etching a portion of one substrate. For example, in the case in which a silicon-on-insulator (SOI) substrate is used, a lower silicon layer may be used as the substrate 110, an insulating layer may be used as the first support parts 130, and an upper silicon layer may be used as the membrane plate 140.

The membrane plate 140 has second support parts 150 formed at both sides thereon. The second support parts 150 serve to form a second air gap b between the membrane plate 140 and the second back plate 160 while simultaneously serving to support the second back plate 160. The second support part 150 may be made of an oxide such as $SiO_2$ or the like, but is not limited thereto.

A height h2 of the second support part 150 is not limited. Since a size of the second air gap b may be changed depending on the height of the second support part 150, the height of the second support part 150 may be adjusted so as to correspond to a desired size of the second air gap b. In addition, when the first air gap a and the second air gap b are to be formed with different sizes, the first support part 130 and the second support part 150 may be formed with different heights.

The second support parts 150 have the second back plate 160 formed thereon. That is, the second back plate 160 has side portions supported by the second support parts 150, such that it is disposed to be spaced apart from the membrane plate 140 by a predetermined interval. Therefore, the second air gap b is formed between the membrane plate 140 and the second back plate 160. Here, the second back plate 160 has a plurality of back plate holes 160a formed in a surface thereof, and air may enter and exit the back plate holes 160a. The second back plate 160 may be made of any one of silver (Ag), aluminum (Al), copper (Cu), chrome (Cr), nickel (Ni), and molybdenum (Mo), or an alloy thereof, but is not limited thereto.

The MEMS microphone 100 according to an exemplary embodiment of the present invention is characterized in that the first back plate 120 and the second back plate 160 are made of a metal, such that electrode pads that have been separately formed in order to electrically connect the first back plate 120 and the second back plate 160 to the membrane plate according to the related art are not required. For example, since the first back plate 120 and the second back plate 160 are made of the metal, in the case in which each of the first back plate 120 and the second back plate 160 is configured as a positive (+) electrode or a negative (−) electrode, separate electrode pads are not required. Therefore, a configuration of the microphone is further simplified.

Since the MEMS microphone 100 configured as described above has two back plates (first and second back plates), a differential capacitive type of MEMS microphone may be configured. For example, when the membrane plate 140 is vibrated by the external sound pressure, a first capacitance may be generated in the first air gap a formed between the membrane plate 140 and the first back plate 120, and a second capacitance may be generated in the second air gap b formed between the membrane plate 140 and the second back plate 160. Here, the first capacitance may be a positive (+) capacitance, and the second capacitance may be a negative (−) capacitance. Therefore, the two capacitances are differentially amplified, thereby making it possible to improve sensitivity of the microphone. Meanwhile, since contents for differential amplification of a plurality of capacitances are well-known, a detail description thereof will be omitted.

Next, a method of manufacturing a MEMS microphone according to an exemplary embodiment of the present invention will be described.

FIGS. 2 to 8 are views showing processes of a method of manufacturing a MEMS microphone according to an exemplary embodiment of the present invention.

Figure 2:
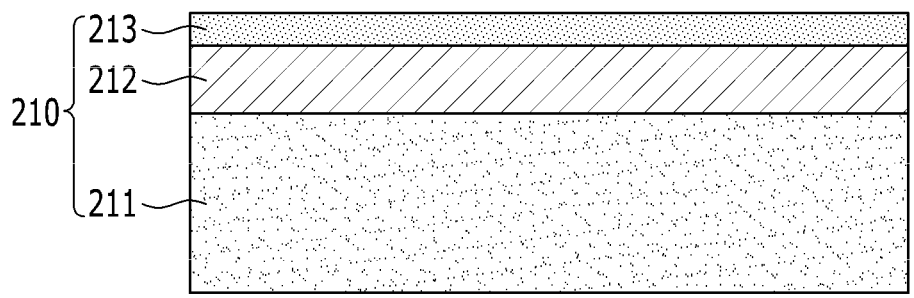
FIGS. 2 to 8 are views showing processes of a method of manufacturing a MEMS microphone according to an exemplary embodiment of the present invention.

Referring to FIG. 2, an integral substrate 210 is first prepared. The integral substrate 210 has a structure in which a base layer 211, a first insulating layer 212, and a membrane layer 213 are sequentially stacked. Here, the base layer 211 may serve as the substrate 110, the first insulating layer 212 may serve as the first support part 130, and the membrane layer 213 may serve as the membrane plate 140. Therefore, in the method of manufacturing a MEMS microphone according to an exemplary embodiment of the present invention, the integral substrate 210 is used, such that the substrate 110, the first support part 130, and the membrane plate 140 may be manufactured without a separate stacking process (see FIG. 1), thereby making it possible to simplify a process. Meanwhile, as the integral substrate 210, an integral substrate that may be obtained by a general method may be used. An example of this integral substrate may include a silicon-on-insulator (SOI) substrate.

The integral substrate 210 may have the structure in which the base layer 211, the first insulating layer 212, and the membrane layer 213 are sequentially stacked. Here, the base layer 211 may be made of silicon, but is not limited thereto. The first insulating layer 212 may be made of a general oxide material and may have a thickness of several micrometers, but is not limited thereto. The membrane layer 213 may be made of a semiconductor material such as silicon or the like, a metal material such as aluminum, copper, nickel, titanium, tungsten, molybdenum, or the like, or a combination thereof. In addition, the membrane layer 213 may be formed in a dual-layer structure in which a metal material is stacked on an insulator material such as a silicon oxide layer, a silicon nitride layer, or the like. The case in which a membrane layer 213 is formed of a single layer has been shown in FIG. 2. A thickness of the membrane layer 213 is not limited, but may be, for example, 1 μm.

Figure 3:
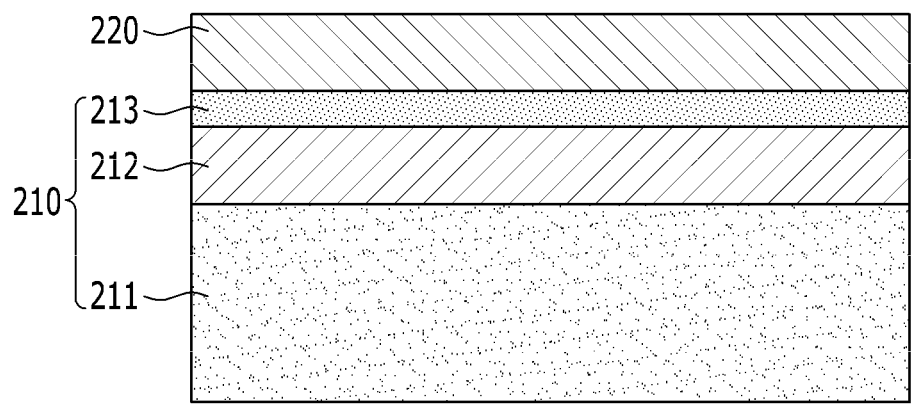

Next, referring to FIG. 3, a second insulating layer 220 is formed on an upper surface of the integral substrate 210. As a method of forming the second insulating layer, a general deposition method may be used. An example of the deposition method may include a low pressure chemical vapor deposition (LPCVD) method, a plasma enhanced chemical vapor deposition (PECVD) method, a physical vapor deposition (PVD) method, a reactive sputtering method performed by injecting gas, and the like, but is not limited thereto.

A thickness of the second insulating layer 220 is not limited. Since the thicknesses of the first and second insulating layers 212 and 220 determine sizes of two air gaps, respectively, they may be determined depending on desired sizes of the air gaps. In addition, the thicknesses of the first and second insulating layers 212 and 220 may be the same as or different from each other.

Figure 4:
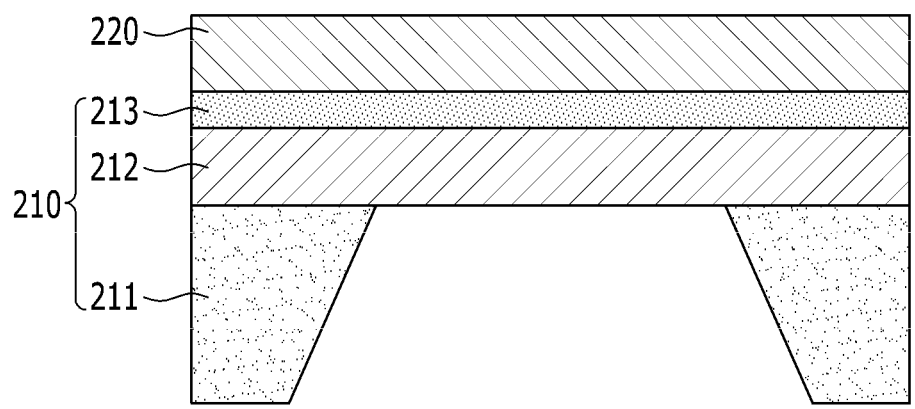

Next, referring to FIG. 4, the central portion C of the base layer 211 of the integral substrate 210 is etched so that a lower surface of the first insulating layer 212 is partially exposed. Here, a method of etching the central portion C (see FIG. 5) of the base layer 211 may be a general method, for example, a dry etching method such as deep reactive ion etching (DRIE), etc., a wet etching method using a solution such as potassium hydroxide (KOH) or tetramethylammonium hydroxide (TMAH), or the like, but is not limited thereto. Meanwhile, when the central portion C of the base layer 211 is etched, it may be etched so that a radius thereof becomes narrow from a lower portion toward an upper portion. When the etching is completed, the lower surface of the first insulating layer 212 is partially exposed.

Figure 5:
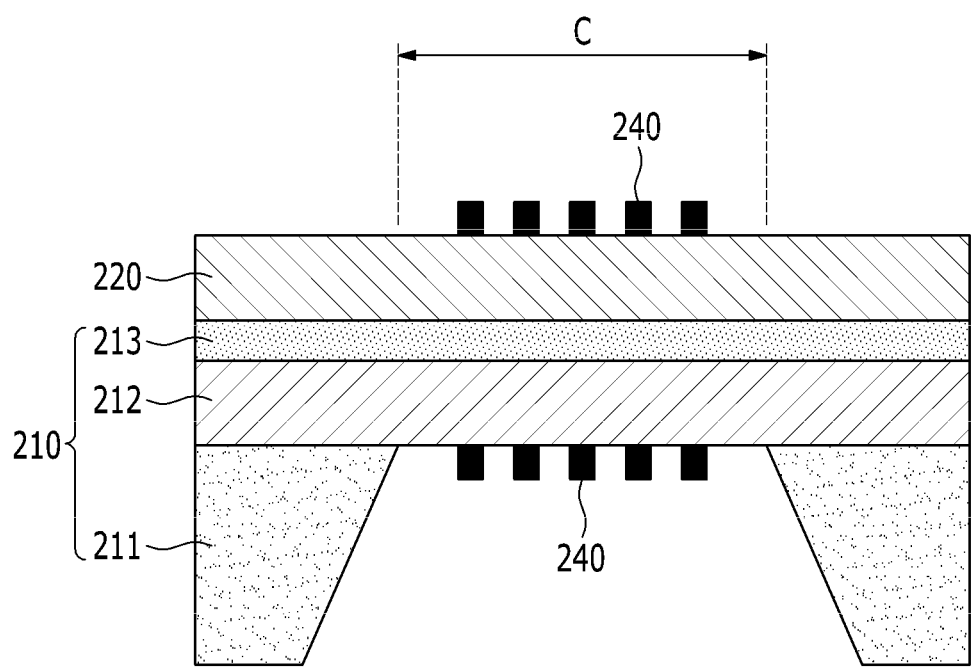

Next, referring to FIG. 5, a plurality of protrusion parts 240 are formed at predetermined intervals on each of the lower surface of the first insulating layer 212 exposed by the etching and an upper surface of the second insulating layer 220. The protrusion parts 240, which are to form back plate holes of back plates, may be formed through patterning using a photolithography process using a photo-resist, or the like. For example, after the photo-resist is applied to the lower surface of the first insulating layer 212 and the upper surface of the second insulating layer 220 by a method such as a spin coating method, a spray coating method, or the like, a mold having a shape of the protrusion part 240 may be formed by an exposure process, or the like.

A size of the protrusion part 240 is not limited. Since the size of the protrusion part 240 corresponds to that of the back plate hole, the size of the protrusion part 240 may be formed so as to be changed depending on a desired size of the back plate hole.

Figure 6:
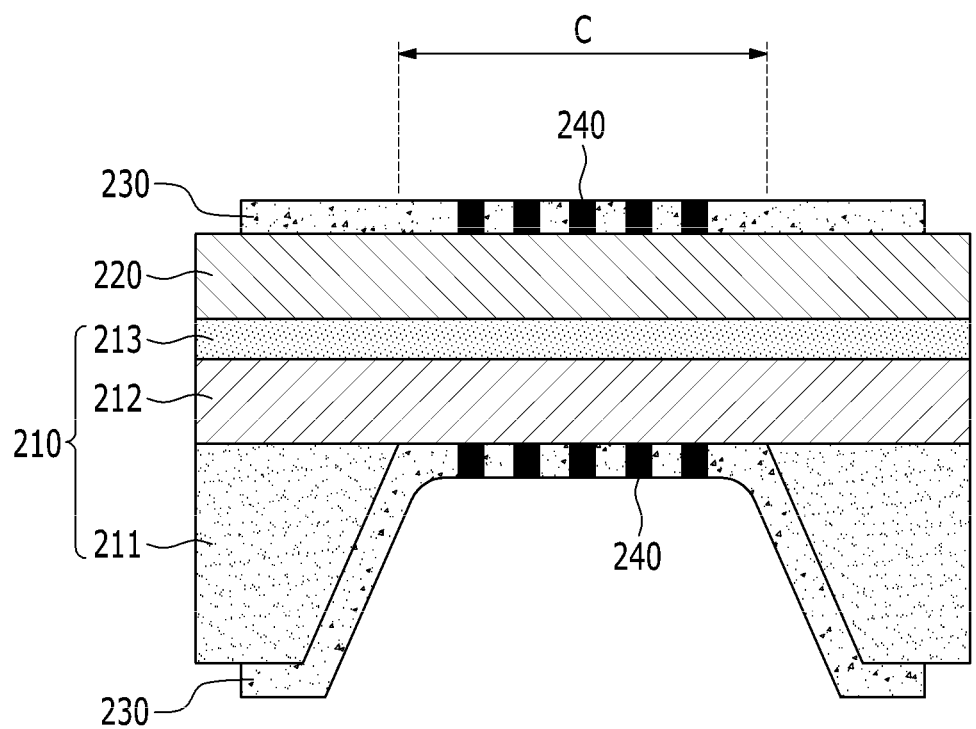

Next, referring to FIG. 6, back plates 230 are formed on the lower surface of the first insulating layer 212 and the upper surface of the second insulating layer 220, respectively, through electroplating. The method of manufacturing a MEMS microphone according to an exemplary embodiment of the present invention is characterized in that the back plates 230 are formed through the electroplating.

The electroplating, which uses a principle in which metal ions are deposited onto a surface of a plated object that is to be plated by forming the plated object as a negative electrode, forming a metal that is to be deposited as a positive electrode, and then allowing electricity to flow in the negative electrode and the positive electrode, has an advantage that a metal structure may be selectively formed. Therefore, in the case in which the back plates 230 are formed through the electroplating, a separate etching process or the like is not required, such that the process may be simplified.

After metal seed layers (not shown) having a predetermined thickness are deposited on the lower surface of the first insulating layer 212 and the upper surface of the second insulating layer 220, respectively, in order to perform the electroplating, the back plates 230 are formed on the lower surface of the first insulating layer 212 and the upper surface of the second insulating layer 220, respectively, through the electroplating. Here, as a method of depositing the metal seed layer, a deposition method such as a sputtering method or the like may be used.

As a metal for forming the back plate 230, an appropriate metal that may be easily plated may be selected and used. An example of this metal may include any one of silver (Ag), aluminum (Al), copper (Cu), chrome (Cr), nickel (Ni), and molybdenum (Mo), or an alloy thereof, but is not limited thereto.

The back plates 230 are formed by electroplating portions except for portions at which the protrusion parts 240 are formed with the metal. Here, a height of the back plate 230 may correspond to that of the protrusion part 240. When the electroplating is complete, the back plates 230 are formed on the exposed lower surface of the first insulating layer 212 and the upper surface of the second insulating layer 220, respectively, such that a dual-back plate structure is formed.

Figure 7:
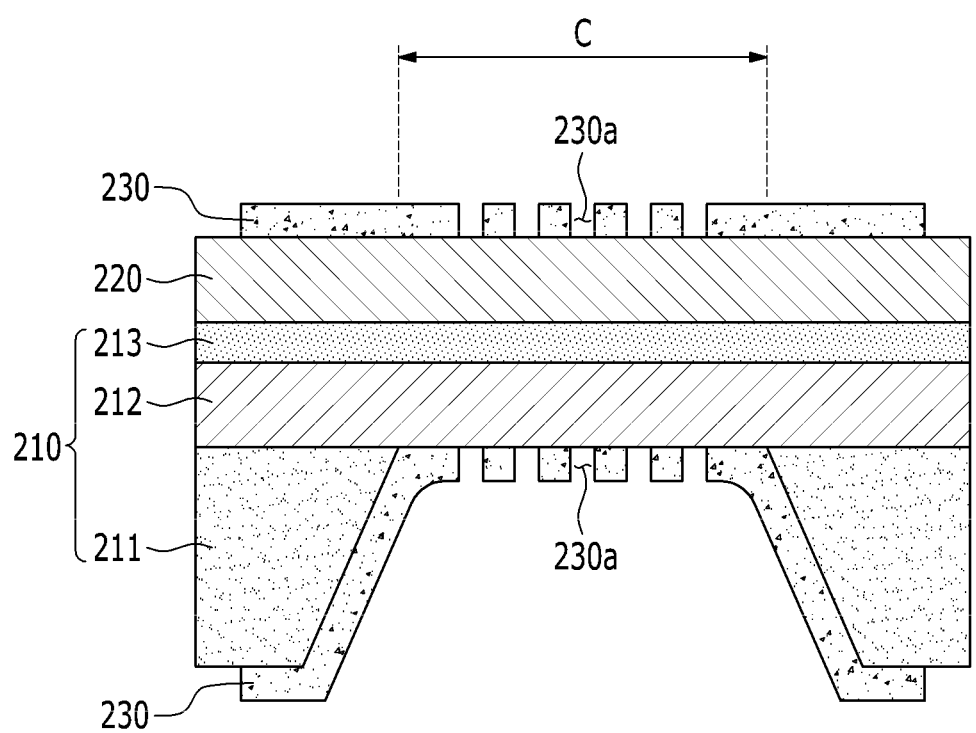

Next, referring to FIG. 7, after the back plates 230 are formed, the protrusion parts 240 are removed. In the case in which the protrusion parts 240 are formed by the photoresist, they may be removed by a dry method such as an ashing method, a wet method using acetone, an exposure process, or the like. When the protrusion parts 240 are removed, a plurality of back plate holes 230a are formed in the back plates 230.

Figure 8:
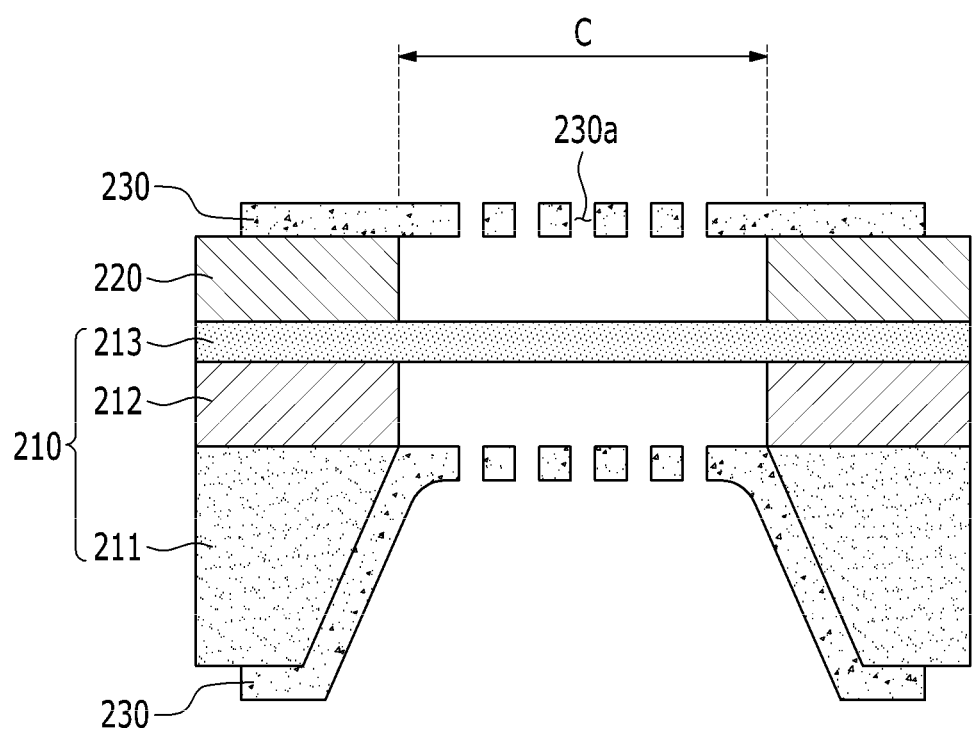

Finally, referring to FIG. 8, the central portions C of the first and second insulating layers 212 and 220 are removed. The first and second insulating layers 212 and 220 may be removed by a wet removal method using an acid, an alkali, or an organic solvent, or a dry removal method such as an ashing method using oxygen plasma through the back plate holes 230a. When the central portions C of the first and second insulating layers 212 and 220 are removed, spaces are formed between the membrane layer 213 of the integral substrate 210 and the two back plates 230, such that air gaps are formed therebetween, respectively. In addition, since the two back plates 230 are made of the metal, they may be utilized as electrodes in and of themselves, so a separate process of forming electrode pads is not required.

As described above, in exemplary embodiments of the present invention, the two back plates are formed above and below the membrane plate to differentially amplify two capacitances, thereby making it possible to improve sensitivity. In addition, the two back plates are made of the metal to serve as the electrode pads in and of themselves, thereby making it possible to simplify a configuration of the microphone. Further, when manufacturing the MEMS microphone, the integral substrate is used and the back plates are formed through the electroplating, thereby making it possible to further simplify a process.

Although an exemplary embodiment of the present invention has been described hereinabove, those skilled in the art may variously modify and alter the present invention by addition, change, removal, or the like, of components without departing from the spirit and scope of the present invention as defined in the following claims. These modifications and alterations are understood to fall within the scope of the present invention.

In exemplary embodiments of the present invention, the two back plates are formed above and below the membrane plate to differentially amplify two capacitances, thereby making it possible to improve sensitivity.

In addition, the two back plates are made of the metal to serve as the electrode pads in and of themselves, thereby making it possible to simplify a configuration of the microphone.

Further, when manufacturing the MEMS microphone, the integral substrate is used and the back plates are formed through the electroplating, thereby making it possible to simplify a process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

INDUSTRIAL APPLICABILITY

In exemplary embodiments of the present invention, the two back plates are formed above and below the membrane plate to differentially amplify two capacitances, thereby making it possible to improve sensitivity.

In addition, the two back plates are made of the metal to serve as the electrode pads in and of themselves, thereby making it possible to simplify a configuration of the microphone.

Further, when manufacturing the MEMS microphone, the integral substrate is used and the back plates are formed through the electroplating, thereby making it possible to simplify a process.

The invention claimed is:

1. A microelectromechanical systems (MEMS) microphone comprising:
   a substrate having a hole at a central portion, the hole penetrating the substrate;
   a first back plate formed on a first surface of the substrate and extended along a wall of the hole and a cross-section of the hole;
   a first support part disposed on a second surface of the substrate and having an empty space at a place corresponding to the hole, the second surface being opposite to the first surface;
   a membrane plate disposed on the first support part and configured to vibrate depending on external sound pressure;
   a second support part disposed on the membrane plate and having an empty space at a place corresponding to the hole; and
   a second back plate disposed on the second support part,
   wherein the first support part is interposed between the substrate and the membrane plate and
   wherein the membrane plate is spaced apart from the first back plate by a height of the first support part, and the second back plate is spaced apart from the membrane plate by a height of the second support part.

2. The MEMS microphone of claim 1, wherein the first and second back plates have a plurality of back plate holes formed therein, respectively.

3. The MEMS microphone of claim 1, wherein the first and second back plates are made of any one of silver (Ag), aluminum (Al), copper (Cu), chrome (Cr), nickel (Ni), and molybdenum (Mo), or an alloy thereof.

4. The MEMS microphone of claim 1, wherein the membrane plate is made of a semiconductor material, a metal material, or a combination thereof, or is formed in a dual-layer structure of an insulator material and the metal material.

5. The MEMS microphone of claim 1, wherein the membrane plate has a plurality of holes formed in a surface thereof, or has a corrugation part formed in at least a portion of the surface thereof.

6. The MEMS microphone of claim 1, wherein the height of the first support part and the height of the second support part are different from each other.

* * * * *